US007589420B2

(12) United States Patent
Karlinski et al.

(10) Patent No.: US 7,589,420 B2
(45) Date of Patent: Sep. 15, 2009

(54) PRINT HEAD WITH REDUCED BONDING STRESS AND METHOD

(75) Inventors: Haggai Karlinski, Ramat Chen (IL); Gil Fisher, Shoham (IL); Roi Nathan, Halfa (IL); Ilan Weiss, Kfar-Saba (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 606 days.

(21) Appl. No.: 11/447,333

(22) Filed: Jun. 6, 2006

(65) Prior Publication Data

US 2007/0279455 A1 Dec. 6, 2007

(51) Int. Cl.
*H01L 23/66* (2006.01)

(52) U.S. Cl. ....................................... 257/729; 257/687

(58) Field of Classification Search .................. 438/20; 347/54; 257/683, 684, 687, 712, 729, 924, 257/E23.002

See application file for complete search history.

(56) References Cited

U.S. PATENT DOCUMENTS

| | | | | |
|---|---|---|---|---|
| 4,133,690 | A | 1/1979 | Muller | |
| 4,295,117 | A | 10/1981 | Lake et al. | |
| 4,532,530 | A | 7/1985 | Hawkins | |
| 5,528,272 | A | 6/1996 | Quinn et al. | |
| 5,774,148 | A | 6/1998 | Cornell et al. | |
| 6,020,646 | A * | 2/2000 | Boyle et al. | 257/783 |
| 6,186,622 | B1 | 2/2001 | Garcia et al. | |
| 6,204,090 | B1 * | 3/2001 | Boyle et al. | 438/108 |
| 6,281,572 | B1 * | 8/2001 | Robbins | 257/700 |
| 6,605,497 | B2 | 8/2003 | Yamazaki et al. | |
| 6,897,123 | B2 * | 5/2005 | Winther | 438/455 |
| 7,055,392 | B2 * | 6/2006 | Muchow et al. | 73/715 |
| 2005/0140731 | A1 | 6/2005 | Silberbrook et al. | |
| 2005/0231551 | A1 | 10/2005 | Gibson et al. | |
| 2006/0109304 | A1 | 5/2006 | Williams | |

FOREIGN PATENT DOCUMENTS

| | | |
|---|---|---|
| EP | 1065059 A | 1/2001 |
| JP | 7-266569 | 10/1995 |
| JP | 8-240497 | 9/1996 |

* cited by examiner

*Primary Examiner*—Matthew Smith
*Assistant Examiner*—Quovaunda Jefferson

(57) ABSTRACT

An ink jet print head includes a silicon ink jet chip, a print head holder, configured to carry and support the silicon chip, and a glass plate, bonded between the silicon chip and the print head holder. The ink jet chip has a coefficient of thermal expansion $\alpha_s$. The print head holder has a holder wall thickness, and a coefficient of thermal expansion $\alpha_h$ that is substantially different from $\alpha_s$. The glass plate has a coefficient of thermal expansion $\alpha_g$ that is substantially similar to $\alpha_s$, and a thickness at least as great as the holder wall thickness, whereby stress created by differential thermal expansion between the silicon chip and the holder is attenuated by the glass plate.

16 Claims, 2 Drawing Sheets

PRINT HEAD WITH REDUCED BONDING STRESS AND METHOD

BACKGROUND

In print head manufacturing, chips with micro-machined silicon arrays are often attached to plastic holders. The micro-machined silicon plates are often covered by a thin and flexible glass membrane. The silicon array structure is in fluid communication with an ink reservoir, and includes multiple ink passageways communicating with ejection nozzles and having actuators (e.g. piezoelectric firing elements) that are selectively actuable to pressurize the ink and eject drops of ink onto print media. The silicon array structure is often adhesively bonded directly to the holder or mount, which can be made from plastic, composite, or other suitable material. In addition to serving as a structural mount or support for the printhead silicon, the holder frequently includes an ink reservoir and other components of the printing system.

One challenge presented by these structures is that there is a large difference in the coefficient of thermal expansion of silicon or glass and that of plastics. Consequently, differential thermal expansion of the silicon array and the plastic holder can produce significant mechanical stress in the glass membrane and the silicon plate. As a result of this stress the silicon array can bend or warp, causing the inkjet nozzles to loose directionality, or it can even crack, destroying the print head. This difference in expansion can also complicate print head production processes that involve the application of elevated temperature, and can complicate print head operation, since large temperature differences cannot be tolerated during operation.

While it is possible to construct a print head holder of a material having a coefficient of thermal expansion similar to silicon or glass, this is generally not economical or practical, and would adversely affect the cost of the print head module.

BRIEF DESCRIPTION OF THE DRAWINGS

Various features and advantages of the invention will be apparent from the detailed description which follows, taken in conjunction with the accompanying drawings, which together illustrate, by way of example, features of the invention, and wherein.

DETAILED DESCRIPTION

Figure 1:
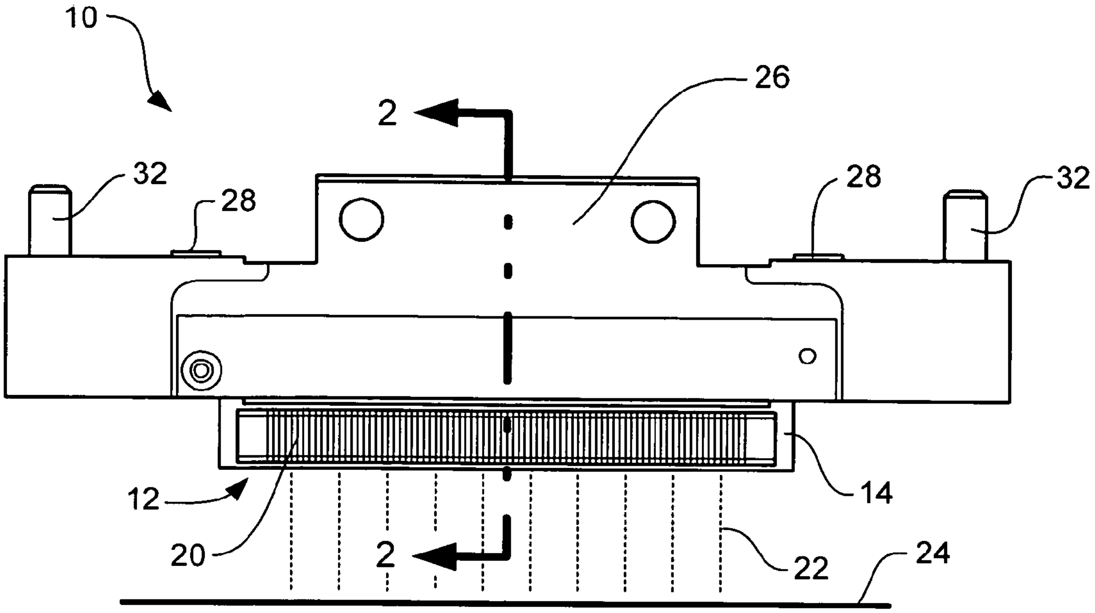
FIG. 1 (PRIOR ART)
FIG. 1 is a front view of a print head module having a micro-machined silicon array bonded to it.

Reference will now be made to exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the invention as illustrated herein, which would occur to one skilled in the relevant art and having possession of this disclosure, are to be considered within the scope of the invention.

Figure 2:
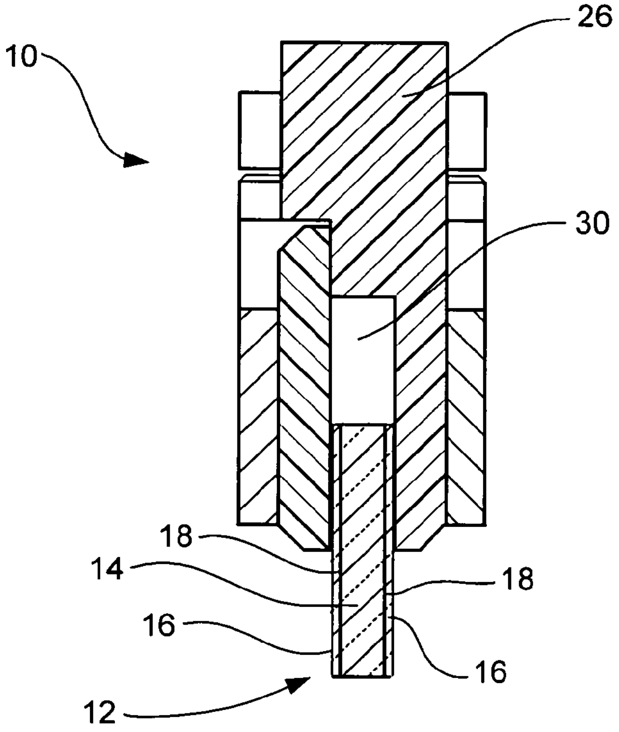
FIG. 2 (PRIOR ART)
FIG. 2 is a side cross-sectional view of the print head module of FIG. 1.

As noted above, chips with micro-machined silicon arrays are often attached to plastic holders in print head arrays. Such a configuration is depicted in FIGS. 1 and 2. The inkjet print head module 10 includes an ink ejection structure 12 formed by a micro-machined silicon plate 14 with a flexible and thin glass membrane 16 bonded to it. The micro-machined silicon plate includes plurality of ink channels formed in one or both of its side surfaces 18, and a plurality of actuators 20 (e.g. piezo electric actuators) are disposed adjacent to each of the ink channels for pressurizing and ejecting ink droplets 22 onto print media 24 (e.g. paper) disposed below the print head module 10.

The ink ejection structure 12 is bonded to a holder 26 by means of adhesive, such as epoxy. The holder supports the ink ejection structure and also includes ink inlets 28 that lead to an internal ink reservoir 30 (shown in the cross-sectional view of FIG. 2), which supplies and distributes ink to the ink channels and nozzles of the ink ejection structure, allowing the ink to be drawn in and ejected as described above. The holder can also include registration pins 32 that provide a mechanical interface between the micro-machined silicon array and a mechanical frame (not shown) of the printer system.

The holder 26 can be made from plastic or polymer materials, composite materials, or any other suitable material. As noted above, however, there is a large difference in the coefficient of thermal expansion of silicon or glass on the one hand, and that of plastic or polymer materials. Specifically, silicon and glass each have coefficients of thermal expansion that are around $3\times10^{-6}/°$ C., while that of polymer materials frequently used for print head modules is typically around $15\text{-}17\times10^{-6}/°$ C.

It will be appreciated that the actuators 20 generate heat, as do other parts of the printing system, and this heat is naturally dispersed throughout the whole system. However, a given change in temperature of the entire system will produce differential expansion of the various components, depending upon their respective coefficients of thermal expansion. Differential expansion of the micromachined array 12 and the plastic holder 26 can produce significant mechanical stress in the glass membrane 16 and the silicon plate 14. As a result of this stress the micromachined array can bend, affecting the directionality of the inkjet nozzles. Even worse, the glass membrane or silicon chip can crack, destroying the print head. The difference in thermal expansion also complicates print head production, which includes processes that involve the application of elevated temperature, such as for curing adhesives or thermally sealing cavities. Differential thermal expansion can also complicate normal print head operation, since large temperature differences cannot be tolerated. While it is possible to construct a print head holder of a material having a coefficient of thermal expansion similar to silicon or glass, this is generally not economical or practical, and would adversely affect the cost of the print head module.

Advantageously, the inventors have developed a structure and method that reduces the stress between a polymer mounting structure and a silicon structure that is bonded thereto. While the structure and method are disclosed herein as applied particularly to inkjet print heads, including micro-machined print heads, it is not limited to these. Rather, it relates generally to any structure having a silicon chip or substrate that is bonded to plastic or some other material having a significantly different coefficient of thermal expansion.

Figure 3:
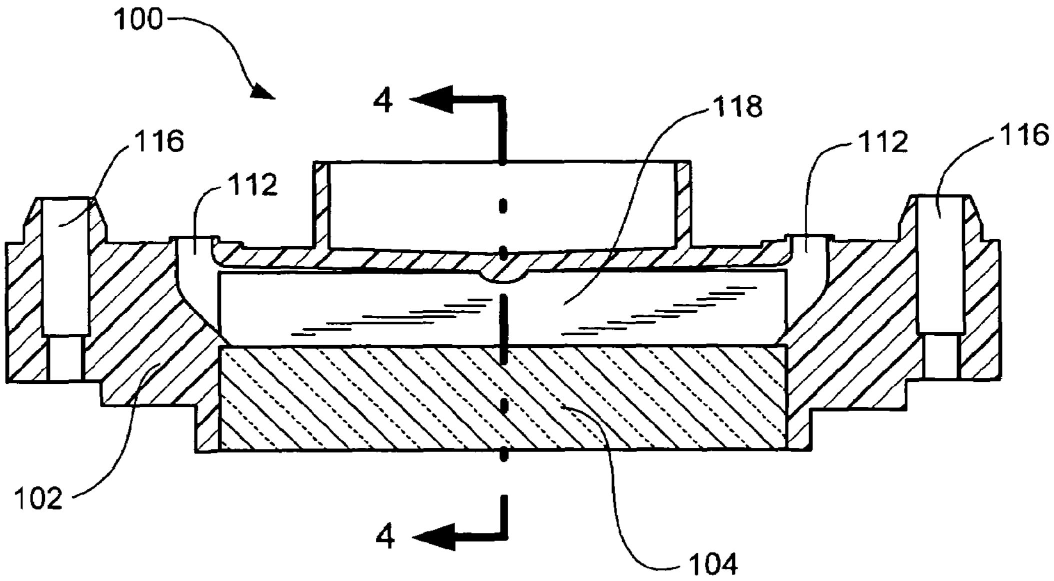
FIG. 3 is a front cross-sectional view of one embodiment of a print head module having a glass plate bonded to the micro-machined array.
Figure 4:
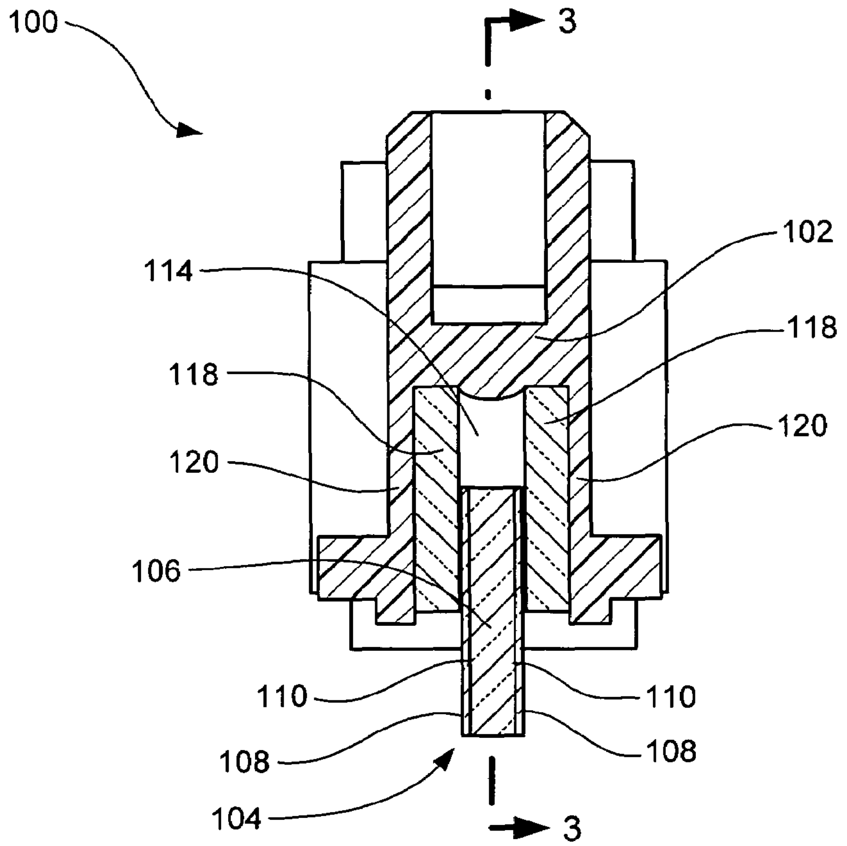
FIG. 4 is a side cross-sectional view of the print head module of FIG. 3.

One embodiment of a print head module 100 having an improved configuration is shown in FIGS. 3 and 4. In this embodiment, the print head module generally includes a holder body 102 of polymer or other material, with a micro-machined silicon array ink ejection structure 104 attached to it. Like the print head structure shown in FIG. 1, the silicon array includes a micro-machined silicon plate 106 with a flexible and thin glass membrane 108 bonded to it, such as by anodic bonding or by adhesive, such as epoxy. The thickness of the glass membrane can be in the range of about 50 microns, though it is not limited to this thickness. Like the embodiment of FIG. 1, the micro-machined silicon plate includes a plurality of ink channels formed in one or both of its side surfaces 110, and a plurality of actuators, such as piezo electric actuators (not shown) for pressurizing and ejecting ink droplets from each ink channel onto print media (not shown).

The holder body 102 includes ink inlets 112 that lead to an internal ink reservoir 114, which provides ink to the silicon array 104. The holder body can also include slots 116 for receiving registration pins to provide a mechanical interface between the micro-machined silicon array and a mechanical frame (not shown) of the printer system.

Unlike the embodiment of FIGS. 1 and 2, the silicon array 104 is not bonded directly to the holder 102. Instead, in the embodiment of FIGS. 3 and 4, the silicon array is bonded (by, e.g. epoxy or other adhesive) to a pair of relatively thick glass mounting plates 118 that are disposed symmetrically on both sides of the silicon array. That is, each side surface 110 of the array is bonded to one side of each glass plate. The opposite side of each glass plate is in turn bonded, e.g. by adhesive, such as epoxy, to the plastic holder 102.

Glass has a thermal expansion coefficient that is nearly identical to that of silicon. Specifically, as noted above, both silicon and glass have coefficients of thermal expansion that are around $3\times10^{-6}/°$ C. However, the holder 102 expands at a rate that is significantly different from glass. For example, polymer materials frequently used for print head modules have a coefficient of thermal expansion in the range of 15 to $17\times10^{-6}/°$ C.

Advantageously, the thickness of the glass mounting plates 118 enables these plates to absorb and attenuate the resultant mechanical stress caused by differential thermal expansion of the silicon array 104 and the holder body 102. The thickness of glass plates is selected such that it enables absorption (attenuation) of forces introduced by thermal expansion of the plastic holder, and does not transfer stress induced by the elevated temperature to the fragile silicon chip ink jet array. Several factors contribute to this function. First, the glass mounting plates are attached to a relatively thin wall section 120 of the holder. The glass mounting plates have a thickness that is at least as great as that of the thin wall section of the holder to which they are bonded. More broadly, the glass plates can have a thickness that is from about 1 to 3 times as thick as the holder wall thickness.

As used herein, the term "holder wall thickness" refers to the minimum typical thickness of the wall 120 of the holder 102 in the region where the glass plates 118 are bonded. While the holder can include gussets and other thicker reinforcing structures that connect to the holder wall and may be integrally formed with it (e.g. by injection molding) in this region, it is the minimum typical wall thickness in this region that is of interest. The holder wall thickness typically varies from about 0.3 mm to about 0.5 mm. Accordingly, the glass plate thickness can range from about 0.3 mm to about 1.5 mm. In one specific embodiment, the glass mounting plates have a thickness of about 0.7 mm, and the holder wall thickness adjacent thereto is about 0.5 mm. The amount of force produced by a particular structure under a given amount of thermal expansion is smaller for a smaller structure. Thus, a thinner holder wall will produce a smaller expansive force than would a thicker wall, and a comparatively thicker stress-attenuation layer will provide a greater force to resist that expansive force.

The thickness of the glass plates 118 also relates to the modulus of elasticity (Young's modulus) of glass versus that of the polymer material of the holder. Polymer materials typically have a modulus of elasticity in the range of from less than 1 to about 4 GPa. Glass, on the other hand, has a modulus of elasticity in the range of about 64 Gpa. Thus a glass plate having the same overall stiffness as the plastic holder would have a thickness that is less than the holder wall thickness. (In order to have the same stiffness as the holder, the glass plate thickness would be proportional to the ratio of the modulus of elasticity of the glass and that of the plastic holder material.) Consequently, where the glass plate has a thickness of from 1 to 3 times that of the holder wall thickness, the mechanical strength of the glass plate and its ability to absorb mechanical stress will be substantially greater than that of the holder wall. To adequately absorb the stress caused by differential thermal expansion, a more elastic (i.e. having a lower modulus of elasticity) stress-attenuation layer will need to be thicker, while a more rigid (i.e. having a higher modulus of elasticity) one can be thinner and still adequately absorb the stress.

Additionally, the thickness of the glass plates reduces the stress produced by differential expansion because stress is a function of force and cross-sectional area of a material. Where there is more material to absorb a given force, the resultant stress will be lower. Since the glass is thicker than the plastic walls of the holder, it makes the silicon array structure stiffer, enables isolation of forces introduced by the plastic expansion (due to elevated temperatures) and protects the fragile silicon chip structure. This reduces the number of print head failures, chip cracks, and increases production yield.

The glass plates 118, used as a stress-attenuation or stress-absorption membrane, interface both with the silicon array chip 104 and the plastic housing 102. The greater thickness of the glass plates 118 absorbs the stress produced by differential thermal expansion of the holder 102, and does not transfer this stress to the fragile silicon chip array 104. Additionally, the glass mounting plates stiffen the print head module as a whole, and make it less sensitive to changes in temperature that occur during bonding or in the course of print head use.

While the disclosure depicts an embodiment of a print head module, the principles disclosed herein apply to any structure wherein a silicon structure is bonded to plastic or some other material having a significantly different coefficient of thermal expansion. Accordingly, there is provided a system and method for attenuating stress from differential thermal expansion between silicon chips/devices and a bonded mounting structure, and in particular, such a system for an inkjet print head structure.

It is to be understood that the above-referenced arrangements are illustrative of the application of the principles of the present invention. It will be apparent to those of ordinary skill in the art that numerous modifications can be made without departing from the principles and concepts of the invention as set forth in the claims.

What is claimed is:

1. An ink jet print head, comprising:

a silicon ink jet chip, having a coefficient of thermal expansion $\alpha_s$;

a print head holder, configured to carry and support the silicon chip, having a holder wall thickness, and having a coefficient of thermal expansion $\alpha_h$ that is substantially different from $\alpha_s$; and a glass plate, bonded between the silicon chip and the print head holder, having a coefficient of thermal expansion $\alpha_g$ that is substantially similar to $\alpha_s$, and a thickness at least as great as the holder wall thickness, whereby stress created by differential thermal expansion between the silicon chip and the holder is attenuated by the glass plate.

2. An ink jet print head in accordance with claim 1, wherein the thickness of the glass plate is greater than a thickness that is proportional to a ratio of the modulus of elasticity of the glass material to the modulus of elasticity of the material of the print head holder.

3. An ink jet print head in accordance with claim 1, wherein the thickness of the glass plate is about 2 times the holder wall thickness.

4. An ink jet print head in accordance with claim 1, wherein the holder wall thickness is no greater than 0.5 mm and the thickness of the glass plate is at least 0.7 mm.

5. An ink jet print head in accordance with claim 1, wherein the glass plate comprises a pair of glass plates of similar size and shape, each glass plate being symmetrically bonded on a first side to opposing sides of the silicon chip, and on a second side to the holder.

6. An ink jet print head in accordance with claim 1, wherein $\alpha_s$ and $\alpha_g$ are in the range of about $3\times10^{-6}$/° C., and $\alpha_h$ is in the range of from 15 TO $17\times10^{-6}$/° C.

7. An ink jet print head in accordance with claim 1, further comprising a glass membrane surrounding the ink jet chip, and bonded between the ink jet chip and the glass plate.

8. An ink jet print head in accordance with claim 7, wherein the glass membrane has a thickness about 1/10 the thickness of the glass plate.

9. A silicon chip assembly, comprising:

a silicon chip, having a coefficient of thermal expansion $\alpha_s$, and being associated with heat-generating elements;

a mounting structure, configured to carry and support the silicon chip, having a wall thickness, and having a coefficient of thermal expansion $\alpha_h$ that is substantially different from $\alpha_s$; and a glass plate, bonded between the silicon chip and the mounting structure, having a coefficient of thermal expansion $\alpha_g$ that is substantially similar to $\alpha_s$, and having a thickness that is at least as great as the wall thickness, whereby stress created by differential thermal expansion between the silicon chip and the mounting structure is attenuated by the glass plate.

10. A silicon chip assembly in accordance with claim 9, wherein the thickness of the glass plate is about 2 times the wall thickness of the mounting structure.

11. A silicon chip assembly in accordance with claim 9, wherein the wall thickness of the mounting structure is less than about 0.5 mm and the thickness of the glass plate is at least 0.5 mm.

12. A silicon chip assembly in accordance with claim 9, wherein $\alpha_s$ and $\alpha_g$ are in the range of about $3\times10^{-6}$/° C., and $\alpha_h$ is in the range of from $15\times10^{-6}$/° C. to $17\times10^{-6}$/° C.

13. A silicon chip assembly in accordance with claim 9, further comprising a glass membrane surrounding the silicon chip, and bonded between the silicon chip and the glass plate.

14. A silicon chip assembly in accordance with claim 13, wherein the glass membrane has a thickness about 1/10 the thickness of the glass plate.

15. A silicon chip assembly in accordance with claim 9, wherein the glass plate comprises a pair of glass plates of similar size and shape, each glass plate being symmetrically bonded on a first side to opposing sides of the silicon chip, and on a second side to the mounting structure.

16. A silicon chip assembly in accordance with claim 9, wherein the silicon chip comprises a micromachined ink jet chip, and the mounting structure comprises a print head holder, having internal ink passageways configured to provide liquid ink to the micromachined ink jet chip.

* * * * *

UNITED STATES PATENT AND TRADEMARK OFFICE

CERTIFICATE OF CORRECTION

PATENT NO. : 7,589,420 B2
APPLICATION NO. : 11/447333
DATED : September 15, 2009
INVENTOR(S) : Haggai Karlinski et al.

It is certified that error appears in the above-identified patent and that said Letters Patent is hereby corrected as shown below:

In column 5, line 28, in Claim 6, delete "TO" and insert -- to --, therefor.

Signed and Sealed this

Thirty-first Day of August, 2010

David J. Kappos
*Director of the United States Patent and Trademark Office*